(12) United States Patent
Koike

(10) Patent No.: US 6,620,643 B1
(45) Date of Patent: Sep. 16, 2003

(54) LIGHT-EMITTING DEVICE USING GROUP III NITRIDE COMPOUND SEMICONDUCTOR

(75) Inventor: Masayoshi Koike, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/631,980

(22) Filed: Aug. 3, 2000

(30) Foreign Application Priority Data

Aug. 5, 1999 (JP) .......................................... 11-222018

(51) Int. Cl.$^7$ .......................... H01L 21/00; H01L 33/00
(52) U.S. Cl. ........................ 438/30; 438/478; 438/492; 438/46; 438/47; 438/796; 257/96; 257/97; 257/14; 257/94; 257/101; 257/103
(58) Field of Search ............................... 257/96, 97, 14, 257/94, 101, 103, 185, 191, 76, 13; 438/478, 492

(56) References Cited

U.S. PATENT DOCUMENTS 5,684,309 A * 11/1997 McIntosh et al. ........... 257/191
5,777,350 A * 7/1998 Nakamura et al. ............. 257/96
5,874,747 A * 2/1999 Redwing et al. ............... 257/77

FOREIGN PATENT DOCUMENTS

| JP | 5-152609 | 6/1993 |
| JP | 8-167737 | 6/1996 |
| JP | 10-22525 | 1/1998 |
| JP | 10-22527 | 1/1998 |

OTHER PUBLICATIONS

Akasaki et al. "Attractiveness Of Devices Emitting Blue Light" Chapter 3, pp. 146–155.

* cited by examiner

Primary Examiner—Matthew Smith
Assistant Examiner—Igwe U. Anya
(74) Attorney, Agent, or Firm—McGinn & Gibb, PLLC

(57) ABSTRACT

A group III nitride compound semiconductor light-emitting device provides a multiple quantum well (MQW) active layer formed on an intermediate layer. The MQW active layer may include, for example, five semiconductor layers having a thickness of approximately 500 Å. The five layers of the MQW active layer may comprise two gallium nitride (GaN) barrier layers each having a thickness of approximately 100 Å and three well layers having different emission wavelengths. The barrier layers and the well layers are stacked alternately. The three well layers may include, for example, an $Al_{0.1}In_{0.9}N$ red-light-emitting well layer having a thickness of approximately 20 Å and doped with impurities (zinc (Zn) and silicon (Si)), a non-doped $In_{0.2}Ga_{0.8}N$ green-light-emitting well layer having a thickness of approximately 50 Å and a non-doped $In_{0.05}Ga_{0.95}N$ blue-light-emitting well layer having a thickness of approximately 30 Å, wherein the three well layers are stacked in the order given.

19 Claims, 6 Drawing Sheets

LIGHT-EMITTING DEVICE USING GROUP III NITRIDE COMPOUND SEMICONDUCTOR

BACKGROUND OF THE INVENTION

1. Field of the Invention

The present invention relates to a light-emitting device (LED), and more particularly to a LED that employs a group III nitride compound semiconductor which provides a wide range of color reproduction and emits white light.

2. Background Art

A variety of white-light-emitting LEDs (light-emitting devices using group III nitride compound semiconductor) are generally known in the art. For example, Isamu AKASAKI describes such an LED in his book entitled *Power of Blue-Light-Emitting Device*, K books series 122, Kogyo Chosakai Publishing Co., Ltd., 1997, (hereinafter to as Reference 1) Japanese Patent Application Laid-Open (kokai) No. 5-152609 (Title: "Light-Emitting Diode") (hereinafter referred to as Reference 2) discloses another such LED.

FIG. 4 shows a cross-sectional view of a conventional semiconductor white-light-emitting device 400, which is disclosed in the aforementioned Reference 1. The conventional semiconductor light-emitting device 400 comprises a group III element nitride compound semiconductor blue-light-emitting device (diode chip), placed in a metal-made cup. A YAG phosphor converts the blue light, introduced around the diode chip, into a yellow light.

FIG. 5 is a graph showing an emission spectrum of the conventional semiconductor light-emitting device 400. The light emitted directly from the chip has a sharp peak at approximately 450 nm, and the light obtained from the phosphor molecules has a broad peak at approximately 550 nm.

The chromaticity of the light emitted from the white-light-emitting LED (conventional semiconductor light-emitting device 400) can be modified by adjusting the amount or composition of the phosphor employed.

FIG. 6 is a chromaticity diagram showing a color reproduction area of the conventional semiconductor light-emitting device 400. As shown in the diagram, an LED emitting light of arbitrary chromaticity can be obtained by adjusting the amount or composition of the phosphor employed. In FIG. 6, the arbitrary chromaticity is included within the central sector of the chromaticity diagram.

In addition, the aforementioned Reference 1 discloses a white-light-emitting "3-in-1 full color LED." In this LED, a semiconductor light-emitting device containing gallium aluminum arsenic (GaAlAs) serves as a red-light-emitting LED chip.

As illustrated in FIG. 6, the conventional semiconductor light-emitting device's range of color reproduction area is insufficient. Therefore, when the light-emitting device is used in a lamp, the task of highlighting green or red images becomes difficult. Thus, a conventional 1-chip semiconductor light-emitting device cannot be used effectively to produce a full color reproduction when installed within a lamp having a wide range of color reproduction area.

In addition, to produce the aforementioned white-light-emitting "3-in-1 full color LED", several chips are required in a conventional device. This induces cumbersome and time-consuming production steps, thereby increasing unfavorably the production cost of the conventional devices.

Moreover, in order to produce a red-light-emitting chip employed in conventional semiconductor light-emitting devices such as the aforementioned "3-in-1 full color LED," arsenic (As) is added to a red-light-emitting semiconductor layer. However, when products containing an arsenic compound are manufactured on a large scale, environmental and ecological concerns must be addressed. These concerns generate problems in productivity and increases the cost to build regulatory-compliant production facilities.

SUMMARY OF THE INVENTION

The present invention overcomes the aforementioned and other problems. Thus, an object of the present invention is to provide a white-light-emitting LED exhibiting a sufficiently wide color reproduction area and is capable of full color reproduction. In addition, the present LED does not contain an arsenic compound and is produced by a comparatively low-cost facility that requires no special environmental considerations.

Accordingly, the present invention provides a light-emitting device that employs a group III nitride compound semiconductor containing stacked semiconductor layers which have a quantum well structure. The group III element nitride compound is represented by the formula, $(Al_xGa_{1-x})_yIn_{1-y}N$ ($0 \leq x \leq 1$; $0 \leq y \leq 1$). At least three of the well layers have compositional proportions which differ from one another. An acceptor impurity and a donor impurity are added to at least one well layer. Furthermore, The chromaticity of light, emitted from each of at least three well layers, is controlled so that the well layers emit lights of different chromaticities so that a white light can be produced. The lights having different chromacities are emitted from each layer and are combined together. The composition of this mixture of light is adjusted and radiated from a light-extraction surface so as to obtain a white light.

Each of the aforementioned well layers may be a single quantum well layer or a multiple quantum well layer and may further contain a thin barrier layer therein. These well layers may or may not interfere with one another.

Preferably, the light-emitting device using a group III nitride compound semiconductor has a red-light-emitting well layer in which the compositional proportion of $Al_yIn_{1-y}N$ is adjusted to satisfy $0 \leq y \leq 0.1$.

Preferably, the light-emitting device using a group III nitride compound semiconductor includes a blue-light-emitting well layer and a green-light-emitting well layer which are formed of $In_{1-y}Ga_yN$ ($0.7 \leq y < 1$) to which no impurity is added.

The blue-light-emitting well layer may be a well layer emitting bluish purple light having a wavelength of 380–455 nm, which is slightly shorter than the wavelength of the blue light of 455–485 nm.

Preferably, the acceptor concentration and the donor concentration are adjusted in the range from $1 \times 10^{17}/cm^3$ to $1 \times 10^{21}/cm^3$, respectively.

Preferably, the acceptor impurity may be, for example, zinc (Zn), beryllium (Be), calcium (Ca), strontium (Sr), barium (Ba), or magnesium (Mg).

Preferably, the donor impurity may be, for example, carbon (C), silicon (Si), tin (Sn), sulfur (S), selenium (Se), or tellurium (Te).

Preferably, the well layers are stacked in descending order such that the emission wavelengths of the layers decrease toward the light-extracting surface.

Preferably, the weighted mean coordinates of the chromaticity coordinates in a chromaticity diagram weighted by the emission intensity of light emitted from the well layers are adjusted to approximately (⅓, ⅓) by controlling the thickness of each well layer, compositional proportions of each well layer, species and concentration impurities added to each well layer, or the number of layers emitting light of the same wavelength.

Various other objects, features, and many of the attendant advantages of the present invention will be readily appreciated as the same becomes better understood with reference to the following detailed description of the preferred embodiments when considered in connection with accompanying drawings.

DETAILED DESCRIPTION OF PREFERRED EMBODIMENTS

The invention will be more fully understood by reference to the following embodiments, but not limited thereto.

The light-emitting device of the present invention comprises a red-light-emitting well layer and at least two other well layers that emit lights having a color other than red. Therefore, the invention includes at least three well layers wherein each of the well layer emits a light of a different chromaticity. The lights emitted from the three well layer are mixed together and radiated from a light-extracting surface to generate a white-light-emitting LED. When the white-light-emitting LED according to the present invention is employed in a lamp, a red image can be highlighted, which could not be highlighted under the radiation of a conventional 1-chip white-light-emitting LED.

The chromaticity coordinates, represented by (x, y), of the mixed light radiated from the light-extracting surface can be represented by the following equation:

$$(_{i=1}\Sigma^n M_i)(x, y) = _{i=1}\Sigma^N \{M_i(x_i, y_i)\} \quad (1)$$

wherein $(x_i, y_i)$ represents a chromaticity coordinate of light emitted from each well layer; $M_1$ represents the emission intensity of light emitted from each well layer; and N represents the total number of well layers.

The compositional proportions of each well layer and the species and concentration of the added impurity may serve as parameters which determine the emission wavelength of each well layer. Similarly, the thickness of each well layer and the number of layers emitting light of the same wavelength may serve as parameters which determine the emission intensity of each well layer.

Accordingly, by appropriately controlling the aforementioned parameters of each well layer, a light having an arbitrary chromaticity, which falls inside a polygon formed from the vertices of the chromaticity coordinates $(x_1, y_1)$, can be obtained.

Figure 3:
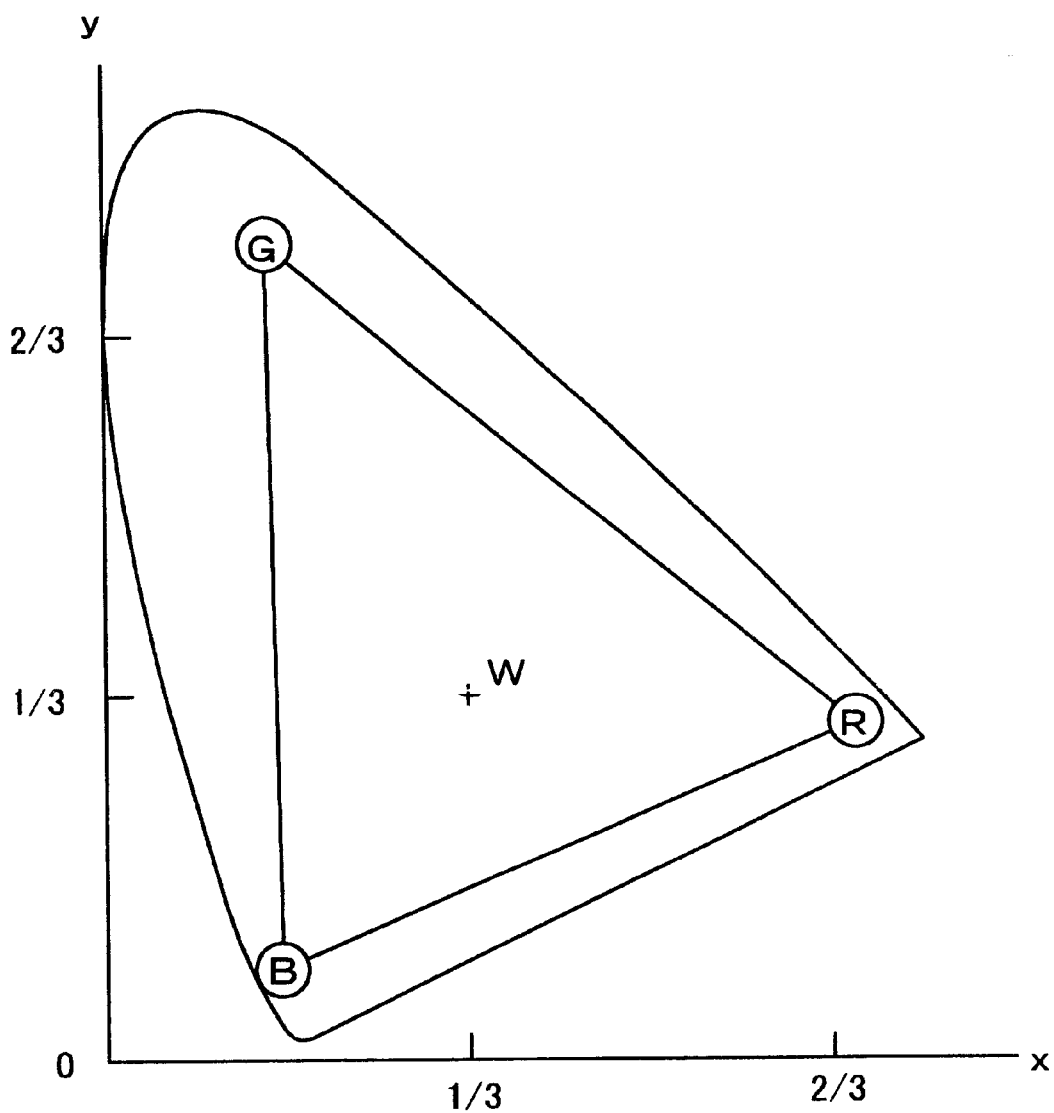
FIG. 3 is a chromaticity diagram showing a color reproduction area of the semiconductor light-emitting device of the invention.
Figure 4:
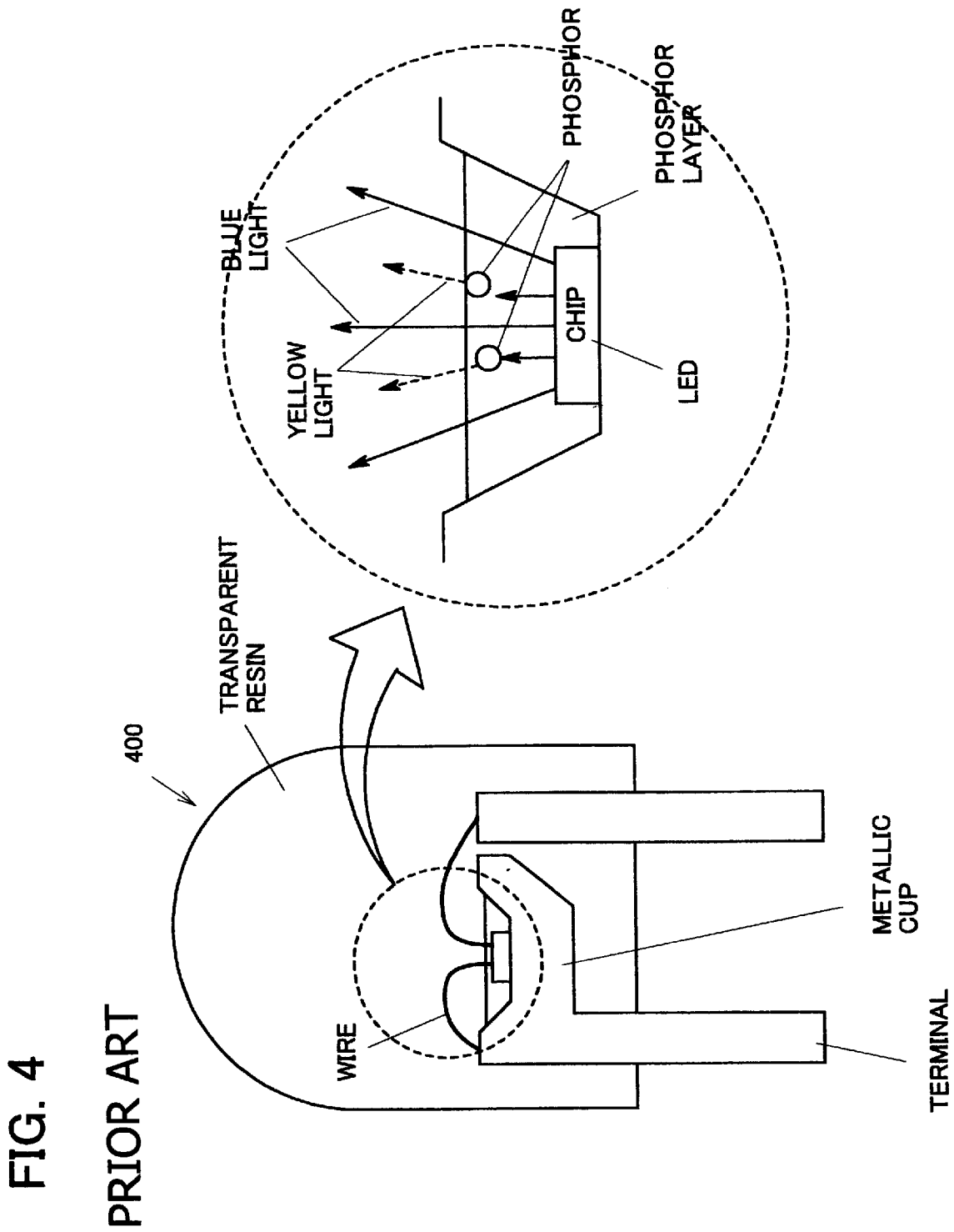
FIG. 4 is a cross-sectional view of a conventional white-light-emitting semiconductor light-emitting device.
Figure 5:
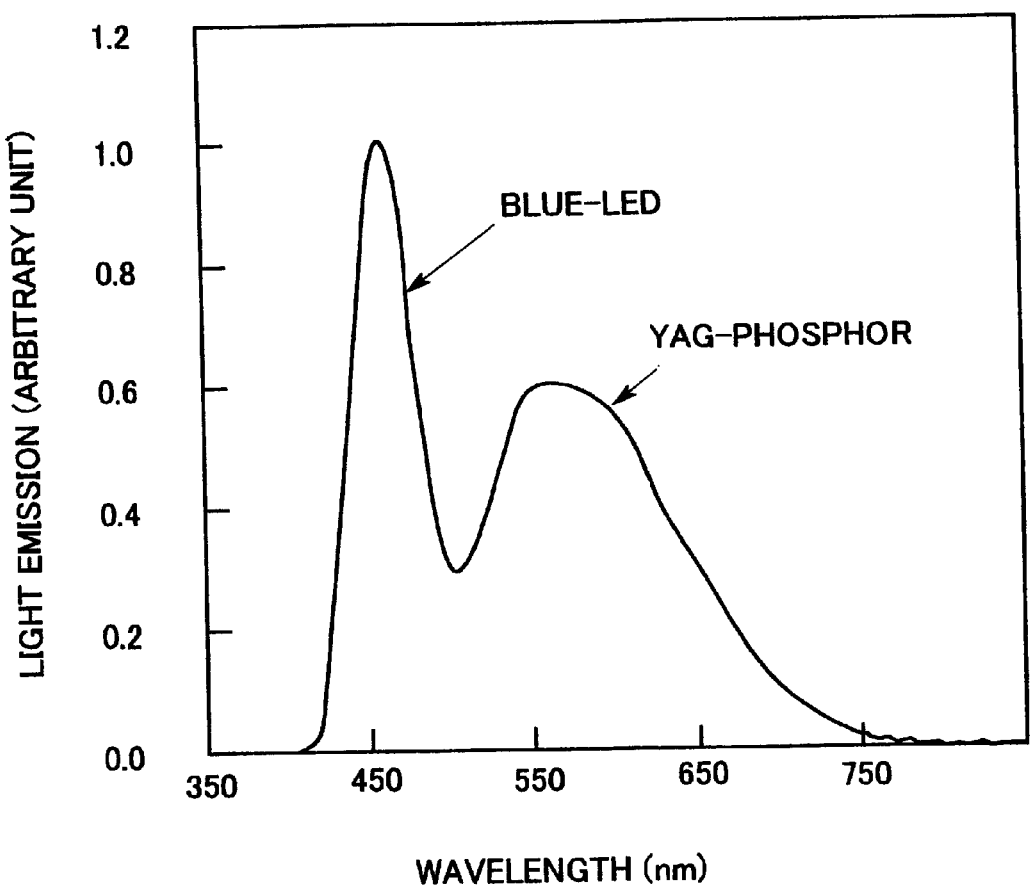
FIG. 5 is a graph showing an emission spectrum of the conventional semiconductor light-emitting device of FIG. 4.
Figure 6:
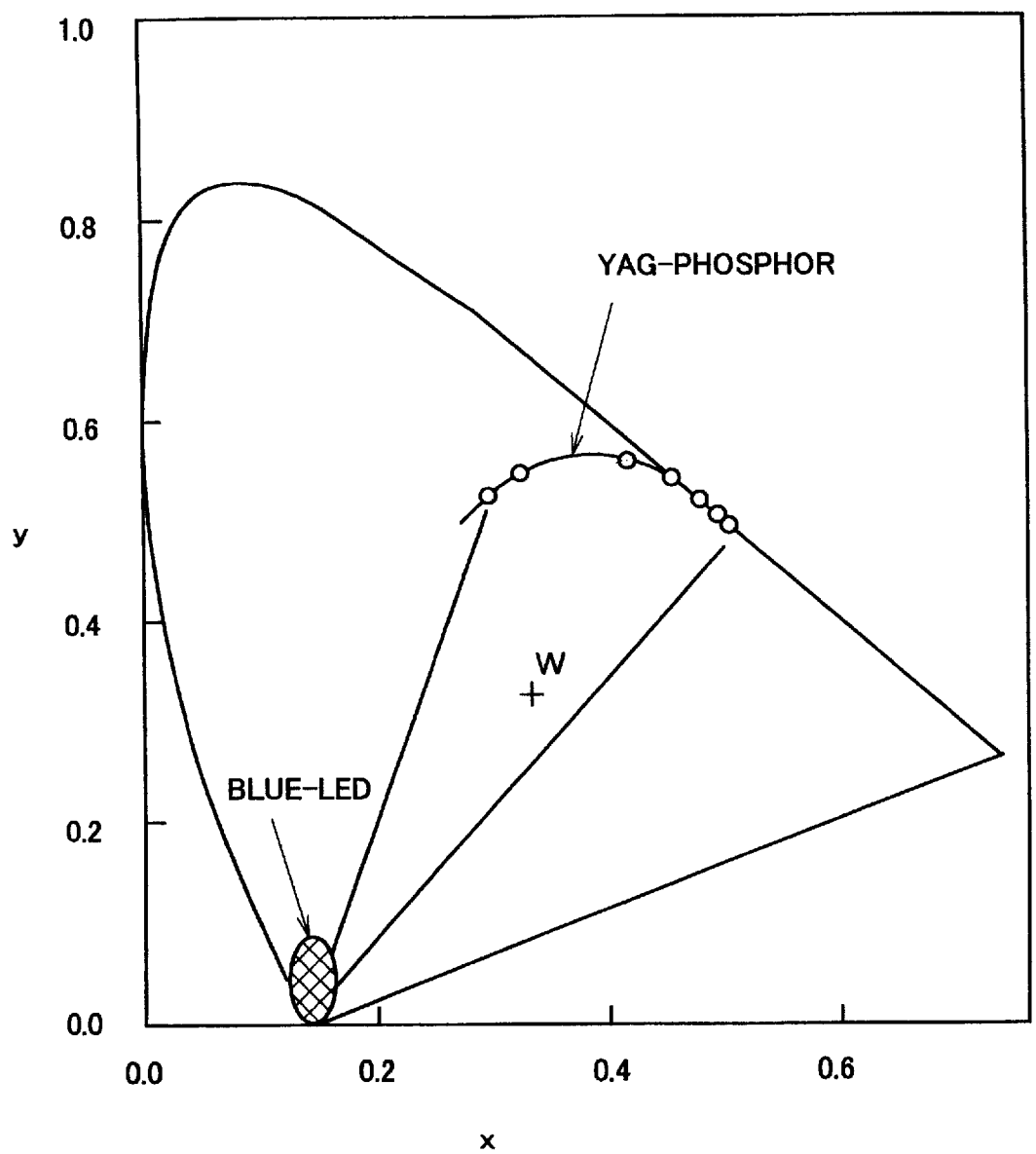
FIG. 6 is a chromaticity diagram showing a color reproduction area of the conventional semiconductor light-emitting device of FIG. 4.

For example, when three layers, such as red-, green-, and blue-light-emitting well layers, are employed, the widest color reproduction area, a triangle, can be obtained on the chromaticity diagram as shown in FIG. 3. The blue-light-emitting well layer may be a well layer emitting bluish purple light having a wavelength of 380–455 nm, which is slightly shorter than the wavelength of the blue light of 455–485 nm.

Thus, the present invention provides a 1-chip white-light-emitting LED having a sufficiently wide color reproduction area and that is capable of providing full color reproduction. Even when the LED is employed in a lamp, such a LED can be produced by adjusting the weighted mean coordinate obtained from the chromaticity coordinates in the chromaticity, diagram and the emission intensity of the light emitted from the well layers to approximately (⅓, ⅓), respectively, and enlarging the aforementioned polygon shown on the chromaticity diagram,.

Furthermore, when the well layers are stacked such that the emission wavelengths of the layers decrease as the layers approach the light-extracting surface, the absorption of light emitted from each well layer into another well layer disposed closer to the light-extraction surface is prevented. Thus, the light extraction efficiency increases, and the chromaticity can be controlled more favorably.

From another prospective of the present invention, the use of an arsenic (As) compound may be omitted from a product made according to the present invention and during the production steps thereof. Thus, a white-light-emitting LED can be produced by a comparatively cheaper facility that requires no special environmental considerations.

EXAMPLES

The present invention will be more fully understood by reference to the following examples, but not limited thereto.

Figure 1:
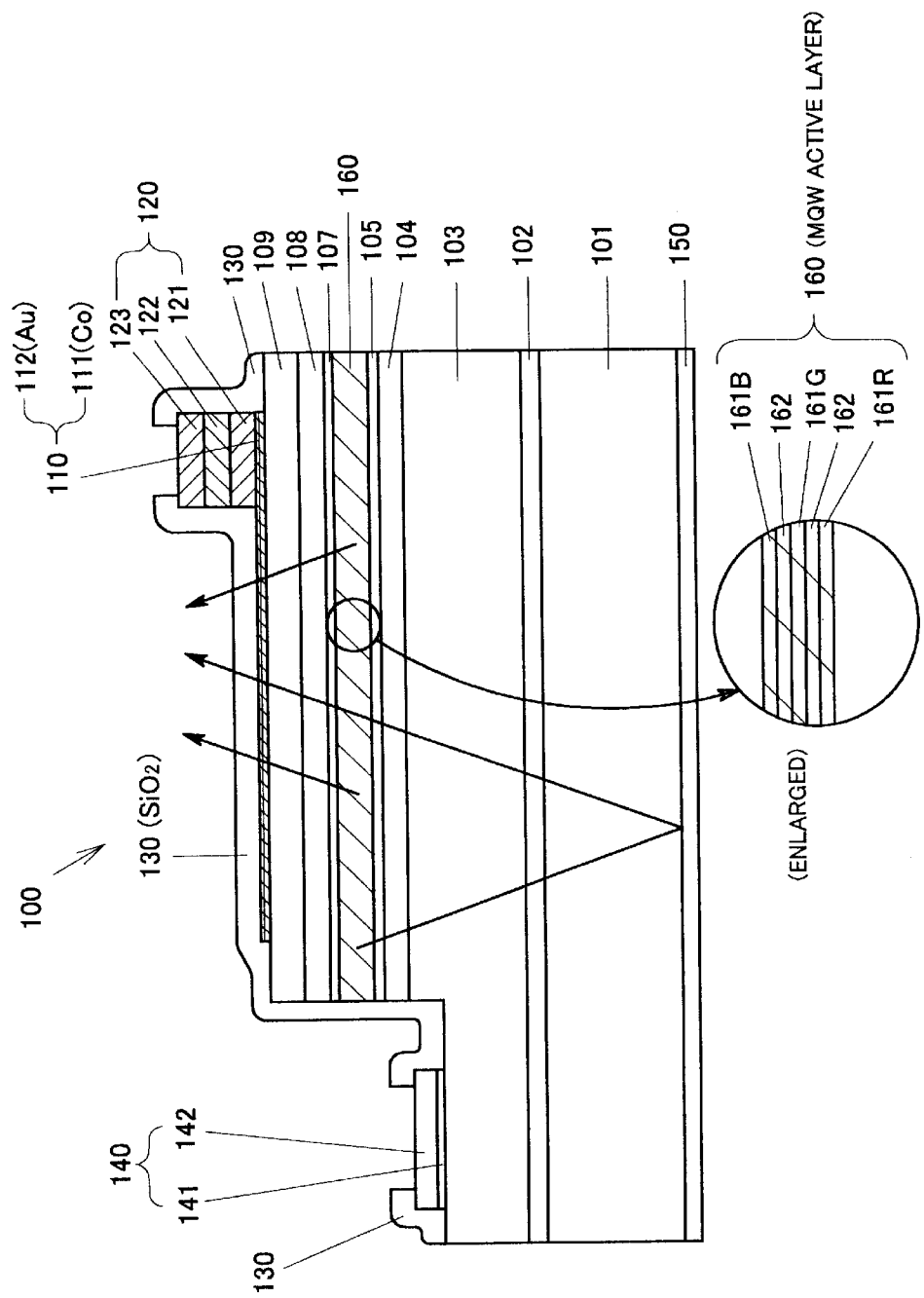
FIG. 1 is a cross-sectional view of a white-light-emitting semiconductor light-emitting device which is described according to an example of the present invention set forth below.

FIG. 1 is a cross-sectional view of a semiconductor light-emitting device 100 of a wire-bonding type. An aluminum nitride (AlN) buffer layer 102 having a thickness of approximately 200 Å is disposed on a sapphire substrate 101. An n-type contact layer 103 comprising silicon (Si)-doped gallium nitride (GaN) and having a thickness of approximately 4.0 μm is further formed thereon.

On the n-type contact layer 103, a non-doped $In_{0.03}Ga_{0.97}N$ intermediate layer 104 having a thickness of approximately 2000 Å is formed. On the intermediate layer 104, an n-type GaN cladding layer 105 having a thickness of approximately 250 Å is produced. A multiple quantum well (MQW) active layer 160, which comprises five semiconductor layers and has a thickness of approximately 300 Å, is formed on the cladding layer 105. The MQW active layer 160 comprises two GaN barrier layers 162 having a thickness of approximately 100 Å and three well layers of different emission wavelengths (161R, 161G, 161B), wherein the layers are stacked alternately.

The three well layers may be, for example, an $Al_{0.1}In_{0.9}N$ red-light-emitting well layer 161R having a thickness of approximately 20 Å A and doped with impurities (Zn and Si), a non-doped $In_{0.2}Ga_{0.8}N$ green-light-emitting well layer 161G having a thickness of approximately 50 Å, and a non-doped $In_{0.05}Ga_{0.95}N$ blue-light-emitting well layer 161B having a thickness of approximately 30 Å. In this embodiment, the three well layers (161R, 161G, 161B), are stacked, in the order in which they are presented, and have a barrier layer 162 disposed alternately therebetween. On the MQW active layer 160, a GaN cap layer 107 having a thickness of approximately 100 Å, an $Al_{0.12}Ga_{0.88}N$ p-type cladding layer 108 having a thickness of approximately 200 Å, and an $Al_{0.05}Ga_{0.95}N$ p-type contact layer 109 having a thickness of approximately 600 Å are successively formed.

A transparent thin-film positive electrode 110 is formed on the p-type contact layer 109, and a negative electrode 140 is formed on the n-type contact layer 103. The transparent thin-film positive electrode 110 comprises a first layer 111 formed of cobalt (Co) and a second layer 112 formed of gold (Au). The first layer contacts the p-type contact layer 109 and has a thickness of approximately 15 Å, and the second layer contacts the cobalt layer 111 and having a thickness of approximately 60 Å.

A thick-film positive electrode 120 comprises a first layer 121 formed of vanadium (V), which has a thickness of approximately 175 Å, a second layer 122 formed of gold (Au), which has a thickness of approximately 15000 Å, and a third layer 123 formed of aluminum (Al), which has a thickness of approximately 100 Å. These three layers are stacked on the transparent thin film electrode 110 successively in the order in which they are presented.

The negative electrode 140 contains a multi-layer structure that is positioned on an exposed portion of the n-type contact layer 103. The multi-layer structure of the negative electrode 140 includes a vanadium (V) layer 141 having a thickness of approximately 175 Å, an aluminum (Al) layer 142 having a thickness of approximately 1000 Å, a vanadium (V) layer 143 having a thickness of approximately 500 Å, a nickel (Ni) layer 144 having a thickness of approximately 5000 Å and a gold (Au) layer 145 having a thickness of approximately 8000 Å. These five layers are successively stacked on the contact layer 103 in the order in which they are presented.

The uppermost potion of the light-emitting device is coated with an $SiO_2$ protective film 130. A light-reflecting metal layer 150, which is formed of aluminum (Al) and has a thickness of approximately 5000 Å, is formed on the bottom of the sapphire substrate 101 through metal vapor deposition.

The light-reflecting metal layer 150 may be formed of a nitride such as titanium nitride (TiN) or hafnium nitride (HfN), as well as of a metal such as rhodium (Rh), titanium (Ti), or tungsten (W).

A method for producing the light-emitting device 100 will be described next.

The aforementioned light-emitting device 100 was produced through a metal organic vapor phase epitaxy (MOVPE) method. The gases employed in the process were ammonia ($NH_3$), carrier gases ($H_2$, $N_2$), trimethylgallium ($Ga(CH_3)_3$, hereinafter abbreviated as TMG), trimethylaluminum ($Al(CH_3)_3$, hereinafter abbreviated as TMA), trimethylindium ($In(CH_3)_3$, hereinafter abbreviated as TMI), silane ($SiH_4$), and cyclopentadienylmagnesium ($Mg(C_5H_5)_2$, hereinafter abbreviated as $CP_2Mg$).

Initially, the sapphire substrate 101, which was formed of a sapphire single crystal having an "a" surface as a main crystal surface, was washed in advance with an organic agent. Then the sapphire substrate 101 was placed on a susceptor disposed in a reaction chamber of an MOVPE apparatus and was baked at 1150° C. while $H_2$ flowed therein at atmospheric pressure.

After the sapphire substrate 101 was cooled to 400° C., the AlN buffer layer 102, having a thickness of approximately 200 Å, was formed by feeding $H_2$, $NH_3$, and TMA into the MOVPE apparatus.

The sapphire substrate 101 was heated to 1150° C. Then, the n-type contact layer 103 formed of GaN, having a thickness of approximately 4.0 μm, was formed by feeding $H_2$, $NH_3$, TMG, and silane into the apparatus. The GaN was doped with Si at a concentration of $2\times10^{18}/cm^3$ based on the electron concentration.

The sapphire substrate 101 was cooled to 850° C. Then, the intermediate layer 104, formed of $In_{0.03}Ga_{0.97}N$ and having a thickness of approximately 2000 Å, was formed by feeding $N_2$ or $H_2$, $NH_3$, TMG, and TMI into the MOVPE apparatus.

After the above intermediate layer 104 was formed, the temperature of the substrate 101 was maintained at 850° C. Then, the n-type GaN cladding layer 105 having a thickness of approximately 250 Å was formed by feeding $N_2$ or $H_2$, $NH_3$, and TMG into the apparatus.

Subsequently, the red-light-emitting well layer 161R, formed of $Al_{0.1}In_{0.9}N$ and having a thickness of approximately 20 Å, was formed by feeding $N_2$ or $H_2$, $NH_3$, TMA, TMI, DEZ, and silane. The aluminum indium nitride was doped at a concentration of $2\times10^{17}/cm^3$ with zinc (Zn), which serves as an acceptor impurity, and at a concentration of $3\times10^{17}/cm^3$ with silicon (Si), which serves as a donor impurity.

The GaN barrier layer 162 having a thickness of approximately 100 Å was formed by feeding $N_2$ or $H_2$, $NH_3$, and TMG into the apparatus. Subsequently, the non-doped green-light-emitting well layer 161G, formed of $In_{0.2}Ga_{0.8}N$ and having a thickness of approximately 50 Å, was formed by feeding $N_2$ or $H_2$, $NH_3$, TMG, and TMI. Then, the next GaN barrier layer 162 having a thickness of approximately 100 Å was formed by feeding $N_2$ or $H_2$, $NH_3$, and TMG into the apparatus.

Subsequently, the non-doped blue-light-emitting well layer 161B, formed of $In_{0.05}Ga_{0.95}N$ and having a thickness of approximately 30 Å, was formed by feeding $N_2$ or $H_2$, $NH_3$, TMG, and TMI.

Thus, the MQW active layer 160, which comprises five semiconductor layers and has a thickness of approximately 300 Å, was formed.

Subsequently, the GaN cap layer 107, having a thickness of approximately 100 Å, was formed by feeding $N_2$ or $H_2$, $NH_3$, and TMG.

The substrate 101 was heated to 1150° C. Then, the p-type cladding layer 108, formed of magnesium (Mg)-doped, p-type $Al_{0.12}Ga_{0.88}N$ and having a thickness of approximately 200 Å, was formed by feeding $N_2$ or $H_2$, $NH_3$, TMG, TMA, and $CP_2Mg$.

The temperature of the substrate 101 was maintained at 1100° C. Then, the p-type contact layer 109, formed of Mg-doped p-type $Al_{0.05}Ga_{0.95}N$ and having a thickness of approximately 600 Å, was formed by feeding $N_2$ or $H_2$, $NH_3$, TMG, TMA, and $CP_2Mg$ into the apparatus.

An etching mask was formed on the p-type contact layer 109, and a predetermined portion of the mask was removed. To prepare the surface of the n-type contact layer 103 for the negative electrode 140, a reactive ion etching process, which employed a Cl-containing gas, was used to remove an unmasked portion of the p-type contact layer 109, the p-type cladding layer 108, the cap layer 107, the MQW active layer 160, the n-type cladding layer 105, the intermediate layer 104, and a portion of the n-type contact layer 103.

The negative electrode 140, which contacts the n-type contact layer 103, and the transparent thin-film positive electrode 110, which contacts the p-type contact layer 109, were formed in the following manner:

(1) A vapor deposition chamber was evacuated to create a vacuum as high as $10^{-4}$ Pa or less. Then, a cobalt (Co) film having a thickness of approximately 15 Å was uniformly formed on the surface of the p-type contact layer 109. The Co film serves as the first layer 111. A layer of gold (Au) serves as the second layer 112 was formed to have a thickness of approximately 60 Å. The Au layer 112 was formed on top of the Co film 111.

(2) A photoresist was applied to the entire surface of the second layer 112. Then, the portion of the photoresist, except the portion corresponding to the transparent thin-film electrode 110, was removed through photolithography.

(3) A portion of Co and Au not covered with the photoresist were removed, and the residual photoresist was removed. Thus the transparent thin-film positive electrode 110 was completed on the p-type contact layer 109.

(4) Next, a window of the photoresist was formed on a predetermined portion of the n-type contact layer 103 through photolithography. After the chamber was evacuated to a vacuum as high as $10^{-4}$ Pa or less, a vanadium (V) film 141, having a thickness of approximately 175 Å, and an aluminum (Al) film 142, having a thickness of approximately 1.8 μm, were successively formed through vapor deposition. The residual photoresist was removed, to thereby form the negative electrode 140 on the exposed portion of the n-type contact layer 103.

Another photoresist was uniformly applied in order to form the thick-film positive electrode 120 on the thus-formed transparent thin-film positive electrode 110. A window was formed in a portion of the applied photoresist corresponding to the thick-film positive electrode 120. Then, the vanadium (V) film 121, having a thickness of approximately 175 Å, the gold (Au) film 122, having a thickness of approximately 15000 Å, and the aluminum (Al) film 123, having a thickness of approximately 100 Å, were successively formed on the transparent thin-film electrode 110 through vapor deposition. The thick-film positive electrode 120 was formed in the same manner as described above; i.e., through a lift-off process.

(5) Heat treatment, for example, by sintering, was performed in order to reduce the contact resistance between the n-type contact layer 103 and the negative electrode 140 and the contact resistance between the p-type contact layer 109 and the transparent thin-film positive electrode 110. Specifically, the atmosphere in the chamber in which the sample was placed was evacuated. Then, $O_2$ was fed into the chamber having an inner pressure of 10 Pa. While this pressure was maintained, the temperature was elevated to approximately 570° C., and the heat treatment was performed for approximately four minutes.

Subsequently, the protective film 130, formed of $SiO_2$, was evenly formed on the exposed portion of the uppermost layer through vapor deposition. In order to form the exposed surfaces on the thick-film positive electrode 120 and the negative electrode 140, two windows of approximately the same surface area were formed through the application of a photoresist, photolithography, and wet-etching process.

The reverse side of the sapphire substrate 101 was coated with a Rh reflecting film 150 through vapor deposition.

As a result, the semiconductor light-emitting device 100 shown in FIG. 1 was produced.

Figure 2:
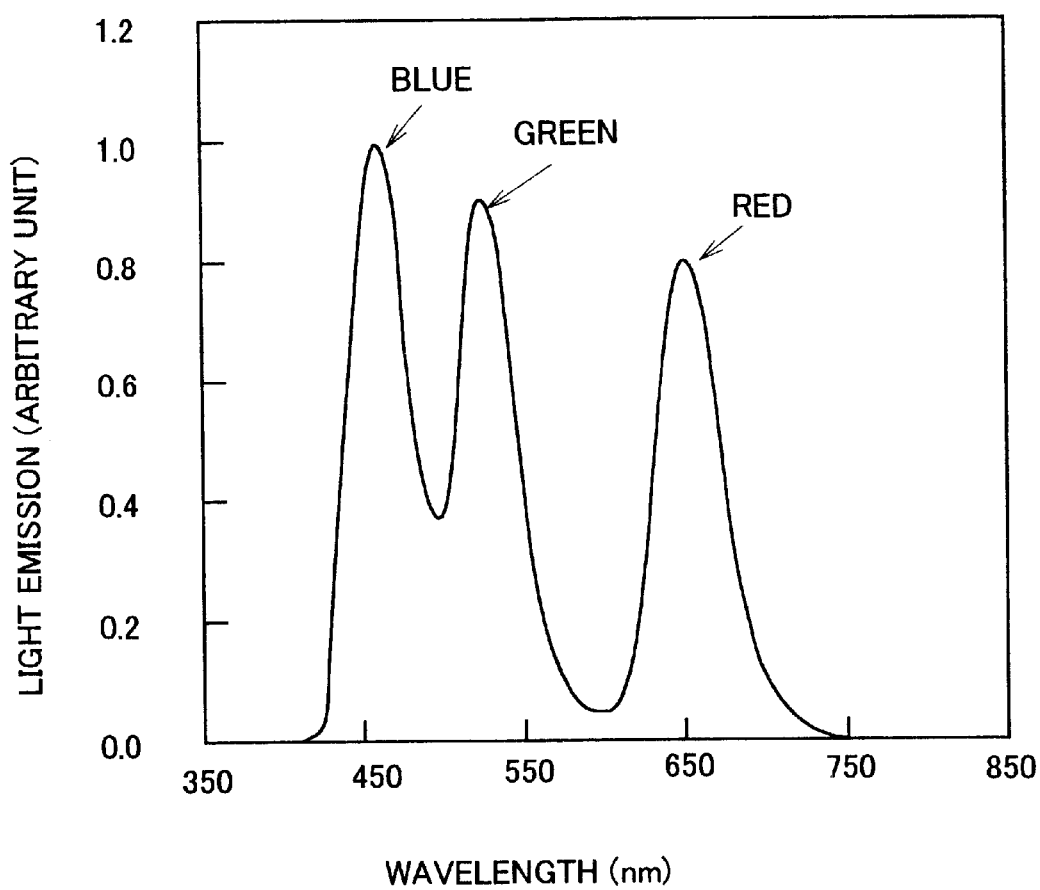
FIG. 2 is a graph showing an emission spectrum of the semiconductor light-emitting device according to the invention.

FIG. 2 is a graph showing an emission spectrum of the semiconductor light-emitting device 100. As shown in FIG. 2, the light emitted from the blue-light-emitting well layer 161B has a sharp emission peak at approximately 460 nm, the light emitted from the green-light-emitting well layer 161G has a sharp emission peak at approximately 530 nm, and the light emitted from the red-light-emitting well layer 161R has a sharp emission peak at approximately 650 nm.

FIG. 3 is a chromaticity diagram showing a color reproduction area of the semiconductor light-emitting device 100. In FIG. 3, each of the symbols R, G, and B denotes the chromaticity at the corresponding red-, green-, and blue-light emitting well layer peaks, respectively.

By controlling the thickness of each well layer, (161R, 161G, and 161B), in the semiconductor light-emitting device 100, the mean coordinate of chromaticity weighed with respect to the emission intensity, which is calculated by Eq. (1), can be adjusted to approximately (⅓, ⅓). These coordinates intersect at the white point W on FIG. 3. The aforementioned Eq. (1) denotes the relationship of the mean coordinate of chromaticity, represented by (x, y), weighed with respect to the emission intensity.

Consequently, a 1-chip white-light-emitting LED can be produced that exhibits a sufficiently wide color reproduction area when employed within a lamp such as a daylight lamp. In other words, when the semiconductor light-emitting device 100 is employed within a lamp, an arbitrary chromaticity, which is included within the central triangle of the chromaticity diagram of FIG. 3, can be reproduced.

In addition, since neither ultraviolet (UV) nor infrared (IR) rays are emitted by the present device, the 1-chip semiconductor light-emitting device 100 can provide a high-energy-conversion-efficiency lamp that generates a soft light which is gentle on a viewer's eyes.

Although the above example presents a wire-bonding-type, 1-chip white-light-emitting LED, any type of LEDs, such as a flip-chip LED, may also be employed in the present invention.

For example, if the LED is a flip-chip LED, the order in which the well layers are stacked in the above example is inverted. In such a case, absorption of the light emitted from each well layer into another well layer disposed closer to the light-extraction surface is prevented, since the well layers are stacked so that the emission wavelengths of the layers decrease toward the light-extracting surface. Thus, similar to the above example, the present invention provides a 1-chip white-light-emitting LED for full color reproduction that exhibits a high-light-extraction-efficiency and produces a sufficiently wide color reproduction area.

In the case of a flip-chip-type LED, the light-reflecting metal layer 150 is not required. Instead of the transparent thin-film positive electrode 110, the invention may contain a non-transparent thick-film electrode, which is formed of a metal having high light reflectance such as rhodium (Rh) and having a thickness of approximately 2000 Å. In this case, the thick-film positive electrode 120 can also be omitted.

In the above-flip-chip LED example, the well layers comprise three layers; i.e., red-, green-, and blue-light-emitting layers. However, other well layers, such as yellow-light-emitting and blue-green-light-emitting well layers, may be included. Thus, when well layers having different emission wavelengths are added, the invention provides a 1-chip white-light-emitting LED for generating full color reproduction that exhibits a wider color reproduction area.

In the above example, the emission intensity of one of the emission wavelengths was modified by adjusting the thickness of the corresponding well layer. However, the emission intensity may also be modified by controlling the number of well layers having one emission wavelength.

The MQW active layer 160 was employed as an active layer in the above example. However, the active layer may also comprise a plurality of single quantum wells. In other words, a well layer structure used in the present invention may comprise single quantum well layers or a multiple quantum well layer. The well layer structure may further contain a thin barrier layer. These well layers may or may not interfere with one another.

The present invention encompasses semiconductor light-emitting devices having an arbitrary quantum well structure as mentioned above.

The amount of zinc and silicon added individually as impurities is approximately $1 \times 10^{17}$–$1 \times 10^{21}$/cm$^3$ so that the desired emissions due to energy transition between impurity levels can be attained.

Examples of acceptor impurity elements of the present invention include, in addition to zinc, Group II elements and Group IV elements. Similarly, examples of donor impurity elements include, in addition to silicon, Group IV elements and Group VI elements.

In the present invention, the term "non-doped layer" refers to a layer to which an impurity is intentionally not added.

A sapphire substrate was employed in the above example. However, material such as Si, SiC, GaN, and MgAl$_2$O$_4$ may also be employed as a substrate for crystal growth. Similarly, although AlN was employed as the buffer layer, AlGaN, GaN, InAlGaN, and similar compounds may also be employed.

A GaN layer was employed as a barrier layer in the MQW active layer 160 in the above example. However, in addition to the GaN layer, there may also be employed a semiconductor layer having a band gap wider than that of a well layer, such as an AlGaN layer, an AlN layer, an AlInN layer, or an InAlGaN layer.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A group III nitride compound semiconductor light-emitting device comprising:
   stacked semiconductor well layers having a quantum well structure and formed of a group III element nitride compound satisfying the formula $(Al_xGa_{1-x})_yIn_{1-y}N$ ($0 \leq x \leq 1$; $0 \leq y \leq 1$);
   wherein at least three of the well layers have compositional proportions which differ from one another, and at least one of the well layers comprises a red-light-emitting well layer having an acceptor impurity and a donor impurity,
   wherein a chromaticity of light emitted from each of the at least three well layers is controlled so that each of the at least three well layers emits light of different chromaticities, the lights emitted from all well layers being combined to form a mixed light, and
   wherein the mixed light is radiated from a light extraction surface and the different chromaticities within the mixed light are adjusted to obtain a white light.

2. A group III nitride compound semiconductor light-emitting device according to claim 1, wherein said red-light-emitting well layer comprises $Al_yIn_{1-y}N$, where $0 \leq y \leq 0.1$.

3. A group III nitride compound semiconductor light-emitting device according to claim 2, wherein the well layers include a blue-light-emitting well layer and a green-light-emitting well layer which are formed of $In_{1-y}Ga_yN$ ($0.7 \leq y < 1$) to which no impurity is added.

4. A group III nitride compound semiconductor light-emitting device according to claim 3, wherein the acceptor impurity concentration and the donor impurity concentration are in a range from $1 \times 10^{17}$/cm$^3$ to $1 \times 10^{21}$/cm$^3$.

5. A group III nitride compound semiconductor light-emitting device according to claim 3, wherein the weighted mean coordinates of a chromaticity coordinate in a chromaticity diagram weighted by an emission intensity of said mixed light emitted from said well layers are adjusted to approximately (⅓, ⅓) by controlling at least one of the thickness of each well layer, compositional proportions of each well layer, the species and concentration of impurities added to each well layer, and the number of layers emitting light of the same wavelength.

6. A group III nitride compound semiconductor light-emitting device according to claim 1, wherein the well layers include a blue-light-emitting well layer and a green-light-emitting well layer which are formed of $In_{1-y}Ga_yN$ ($0.7 \leq y < 1$) to no impurity is added.

7. A group III nitride compound semiconductor light-emitting device according to claim 1, wherein the acceptor concentration and the donor concentration are in a range from $1 \times 10^{17}$/cm$^3$ to $1 \times 10^{21}$/cm$^3$.

8. A group III nitride compound semiconductor light-emitting device according to claim 1, wherein said acceptor impurity comprises at least one of zinc (Zn), beryllium (Be), calcium (Ca), strontium (Sr), barium (Ba), and magnesium (Mg).

9. A group III nitride compound semiconductor light-emitting device according to claim 1, wherein said donor impurity comprises at least one of carbon (C), silicon (Si), tin (Sn), sulfur (S), selenium (Se), and tellurium (Te).

10. A group III nitride compound semiconductor light-emitting device according to claim 1, wherein said well layers are stacked so that the emission wavelengths of the layers decrease as the well layers approach the light-extracting surface.

11. A group III nitride compound semiconductor light-emitting device according to claim 1, wherein the weighted mean coordinates of a chromaticity coordinate in a chromaticity diagram weighted by an emission intensity of said mixed light emitted from said well layers are adjusted to approximately (⅓, ⅓) by controlling at least one of the thickness of each well layer, compositional proportions of each well layer, the species and concentration of impurities added to each well layer, and the number of layers emitting light of the same wavelength.

12. A group III nitride compound semiconductor light-emitting device comprising:
   stacked semiconductor well layers having a quantum well structure and comprising a group III element nitride compound satisfying the formula $(Al_xGa_{1-x})_yIn_{1-y}N$ ($0 \leq x \leq 1$; $0 \leq y \leq 1$);
   wherein at least three of the well layers have compositional proportions which differ from one another;
   an acceptor impurity and a donor impurity added to at least one of the well layers; and
   wherein a chromaticity of light emitted from each of the at least three well layers is controlled so that each of the at least three well layers emits light of different chromaticities, the lights emitted from all well layers being combined to form a mixed light, and wherein the mixed light is radiated from a light extraction surface and the different chromaticities within the mixed light are adjusted to obtain a white light, wherein the well layers include a blue-light-emitting well layer, and a green-light-emitting well layer, both of which are formed of $In_{1-y}Ga_yN$ ($0.7 \leq y \leq 1$), and a red-light-emitting layer which is formed of $Al_yIn_{1-y}N$ ($0 \leq y \leq 0.1$) doped with zinc (Zn) and silicon (Si).

13. A group III nitride compound semiconductor light-emitting device according to claim 12, wherein the weighted mean coordinates of a chromaticity coordinate in a chromaticity diagram weighted by an emission intensity of said mixed light emitted from said well layers are adjusted to approximately (⅓, ⅓) by controlling at least one of the thickness of each well layer, compositional proportions of each well layer, the species and concentration of impurities added to each well layer, and the number of layers emitting light of the same wavelength.

14. A group III nitride compound semiconductor light-emitting device comprising:

a quantum well structure comprising a plurality of semiconductor well layers comprising a group III nitride compound satisfying the formula $(Al_xGa_{1-x})_yIn_{1-y}N$ ($0 \leq x \leq 1$; $0 \leq y \leq 1$), wherein at least one of said well layers comprises a red-light-emitting well layer having an acceptor impurity and a donor impurity, and wherein light emitted from said red-light-emitting well layer is combined with light from other well layers to form a white light.

15. A group III nitride compound semiconductor light-emitting device according to claim 14, wherein at least three of said well layers have different compositional proportions and emit light of different chromaticities.

16. A group III nitride compound semiconductor light-emitting device according to claim 14, further comprising:

a light extraction surface, said white light being radiated from said light extraction surface.

17. A group III nitride compound semiconductor light-emitting device according to claim 14, wherein said red-light-emitting well layer comprises $Al_yIn_{1-y}N$, where $0 \leq y \leq 0.1$.

18. A group III nitride compound semiconductor light-emitting device according to claim 14, wherein said plurality of semiconductor well layers comprises a blue-light-emitting well layer and a green-light-emitting well layer, each comprising $In_{1-y}Ga_yN$ ($0.7 \leq y \leq 1$).

19. A method of fabricating a group III nitride compound semiconductor light-emitting device, said method comprising:

forming a quantum well structure comprising a plurality of semiconductor well layers comprising a group III nitride compound satisfying the formula $(Al_xGa_{1-x})_yIn_{1-y}N$ ($0 \leq x \leq 1$; $0 \leq y \leq 1$), wherein at least one of said well layers comprises a red-light-emitting well layer having an acceptor impurity and a donor impurity, and wherein light emitted from said red-light-emitting well layer is combined with light from other well layers to form a white light.

* * * * *

UNITED STATES PATENT AND TRADEMARK OFFICE
CERTIFICATE OF CORRECTION

PATENT NO. : 6,620,643 B1
DATED : September 16, 2003
INVENTOR(S) : Masayoshi Koike It is certified that error appears in the above-identified patent and that said Letters Patent is hereby corrected as shown below:

Column 10,
Line 58, replace "($_0 \leq x \leq 1$; $0 \leq y \leq 1$)" with -- ($0 \leq x \leq 1$; $0 \leq y \leq 1$) --.

Column 11,
Line 6, replace "($0.7 \leq y \leq 1$)" with -- ($0.7 \leq y < 1$) --.

Column 12,
Line 15, replace "($0.7 \leq y \leq 1$)" with -- ($0.7 \leq y < 1$) --.
Line 22, replace "($0 \leq x \leq 1$); $0 \leq y \leq 1$" with -- ($0 \leq x \leq 1$); $0 \leq y \leq 1$) --.

Signed and Sealed this

Second Day of March, 2004

JON W. DUDAS
*Acting Director of the United States Patent and Trademark Office*